US012500794B2

(12) United States Patent
Kim et al.

(10) Patent No.: US 12,500,794 B2
(45) Date of Patent: Dec. 16, 2025

(54) DIFFERENTIAL ENVELOPE DETECTOR HAVING COMMON MODE FEEDBACK

(71) Applicant: UNIQCONN INC., Seongnam-Si (KR)

(72) Inventors: Chang Wan Kim, Busan (KR); Jin Seok Kim, Seongnam-si (KR)

(73) Assignee: UNIQCONN INC., Seongnam-Si (KR)

( * ) Notice: Subject to any disclaimer, the term of this patent is extended or adjusted under 35 U.S.C. 154(b) by 0 days.

(21) Appl. No.: 18/787,097

(22) Filed: Jul. 29, 2024

(65) Prior Publication Data

US 2024/0388473 A1 Nov. 21, 2024

(30) Foreign Application Priority Data

Jan. 27, 2024 (KR) .................. 10-2022-0012160

(51) Int. Cl.
*H03F 3/24* (2006.01)
*H03K 5/1532* (2006.01)
*H04L 25/02* (2006.01)

(52) U.S. Cl.
CPC ......... *H04L 25/0272* (2013.01); *H03F 3/245* (2013.01); *H03K 5/1532* (2013.01); *H03F 2200/102* (2013.01)

(58) Field of Classification Search
CPC .......... G01R 19/00; G01R 19/04; H03G 3/00; H03G 3/30; H03F 1/02; H03F 1/32; H03F 3/24; H03F 3/45; H03K 5/02; H03K 5/1532; H03K 17/22; H04L 25/02; H04L 27/06
USPC ........ 330/253, 258, 261; 375/219, 260, 262, 375/267, 295–297, 316, 340
See application file for complete search history.

(56) References Cited

U.S. PATENT DOCUMENTS

| | | | |
|---|---|---|---|
| 2012/0314816 A1 | 12/2012 | Hsieh | |
| 2017/0214374 A1* | 7/2017 | Tajalli | .................. H03G 3/3089 |
| 2017/0343589 A1 | 11/2017 | Mukherjee et al. | |

FOREIGN PATENT DOCUMENTS

| | | |
|---|---|---|
| KR | 10-2012-0100465 A | 9/2012 |
| KR | 101274157 B1 | 6/2013 |
| KR | 10-2015-0039240 A | 4/2015 |
| KR | 10-2018-0092706 A | 8/2018 |
| KR | 102198548 B1 | 1/2021 |

* cited by examiner

*Primary Examiner* — Shawkat M Ali
(74) *Attorney, Agent, or Firm* — Studebaker Brackett PLLC

(57) ABSTRACT

The present invention relates to a differential envelope detector, which comprises: input terminals for separating cathode and anode components from a signal and receiving same; a first voltage output unit for outputting a first common mode voltage between the input terminals; a first amplification unit, which receives an input signal as a differential pair and amplifies same so as to output a first output signal; a second amplification unit, which receives the first common mode voltage so as to output a second output signal; and a second voltage output unit for outputting a second common mode voltage between a constant current source unit and an output terminal, wherein the output size of the detector is hardly affected by temperature changes, and an output DC voltage is also fixed so as to be effective with respect to input bias of the next stage amplifier.

5 Claims, 8 Drawing Sheets

DIFFERENTIAL ENVELOPE DETECTOR HAVING COMMON MODE FEEDBACK

CROSS-REFERENCE TO RELATED PATENT APPLICATION

This application claims the benefit of Korean Patent Application No. 10-2022-0012160, filed on Jan. 27, 2022, in the Korean Intellectual Property Office, the disclosure of which is incorporated herein in its entirety by reference.

TECHNICAL FIELD

The present invention relates to a differential envelope detector (ED) used in an asynchronous communication method utilizing an ultra-high frequency shortwave carrier signal and pulse amplitude modulation, and more specifically, to a differential ED having common mode feedback with a minimized influence of a temperature change when providing a differential signal output.

BACKGROUND ART

A typical envelope detector (ED) used in asynchronous communication has a structure with differential inputs and a single output as shown in FIG. 1.

In this case, since all receiver circuits located after an output terminal of the ED have a differential structure, a circuit for converting a single output signal of the ED into differential signals is additionally required between the ED and a differential receiver circuit at a next stage.

According to this necessity, an ED with a differential output structure as shown in FIG. 2 has been proposed in the related art.

The conventional circuit structure shown in FIG. 2 has a form in which a single-differential signal conversion circuit is added to a next stage of the ED with the differential-single structure shown in FIG. 1 and is designed such that a low-pass filter (LPF) 21 for supplying the same DC voltage to gates of transistors M3 and M4 constituting the single-differential signal conversion circuit is connected to an output of the ED in parallel to remove a single-phase signal component and extract an average DC voltage of a corresponding signal.

However, in the case of the conventional circuit structure shown in FIG. 2, since a DC voltage extracted through the LPF (21) is an average voltage for an output signal of the ED other than a gate DC voltage of the transistor M3, there is a problem in that a DC offset may occur between gate voltages of the transistors M4 and M3, and a DC offset also increases as a value of the single output signal of the ED increases.

(Patent Document 1) KR 10-1274157 B1
(Patent Document 2) KR 10-2018-0092706 A

DISCLOSURE

Technical Problem

An objective of the present invention for solving is directed to providing a differential envelope detector (ED) having common mode feedback with a minimized influence of a temperature change when providing a differential signal output for asynchronous communication utilizing an ultra-high frequency shortwave carrier signal and pulse amplitude modulation.

Technical Solution

A differential envelope detector (ED) according to one aspect of the present invention for achieving the above objective includes an input terminal unit including first and second input terminals configured to respectively receive positive and negative components of a radio frequency (RF) signal received through an antenna or a low-noise amplifier, a first voltage output unit provided between the first and second input terminals and configured to output a first common mode voltage, a first amplification unit configured to receive first and second input signals respectively corresponding to the positive and negative components of the RF signal as a differential pair and amplify the first and second input signals to output a first output signal, a second amplification unit configured to receive the first common mode voltage and operate in a current amplifier mode to output a second output signal, a constant current source unit configured to supply a constant DC current to the first amplification unit and the second amplification unit, an output terminal including first and second output terminals to which the first output signal and the second output signal are applied, respectively, and a second voltage output unit provided between the first and second output terminals and configured to output a second common mode voltage.

Preferably, the differential ED may further include a feedback output unit configured to compare the second common mode voltage with a preset reference voltage, generate a signal obtained by amplifying an error between the two voltages, and output the signal to the first voltage output unit as feedback.

In addition, the first voltage output unit may include a pair of input impedance elements, may be connected between the first and second input terminals, and may be biased to the first common mode voltage based on the feedbacked output signal.

Preferably, the second voltage output unit may include a pair of output impedance elements and may be connected between the first and second output terminals; the feedback output unit may include an operational amplifier configured to generate a signal obtained by amplifying the error; and the reference voltage may be applied to an inverting input terminal of the operational amplifier, and a non-inverting input terminal of the operational amplifier may be connected between the pair of output impedance elements.

Preferably, each of the first amplification unit and the second amplification unit may include a differential amplification circuit in which a pair of n-channel metal oxide semiconductor (NMOS) transistors with the same size, which face each other, are disposed in a differential structure; the constant current source unit may include a current source transistor whose drain terminal is connected to a common source line to which source terminals of the first and second amplification units are commonly connected, and while a leakage current of a small signal current of the first amplification unit is minimized when the current source transistor operates as a constant current source, the current source transistor may supply a remaining current not including the leakage current of the small signal current to a common source of the second amplification unit.

Advantageous Effects

According to the present invention, an output value of an envelope detector (ED) can be hardly affected by a temperature change, and an output DC voltage can also be fixed constantly so that there is an advantageous effect on an input bias of an amplifier at a next stage.

According to the present invention, since the ED provides a differential output signal by itself, there is no need to add a single-differential conversion circuit, and since all circuits of a receiver form a differential structure, there is an effect of being able to minimize a change in power supply voltage due to an instantaneous current change, thereby reducing noise and supplying stable power.

MODES OF THE INVENTION

Figure 1:
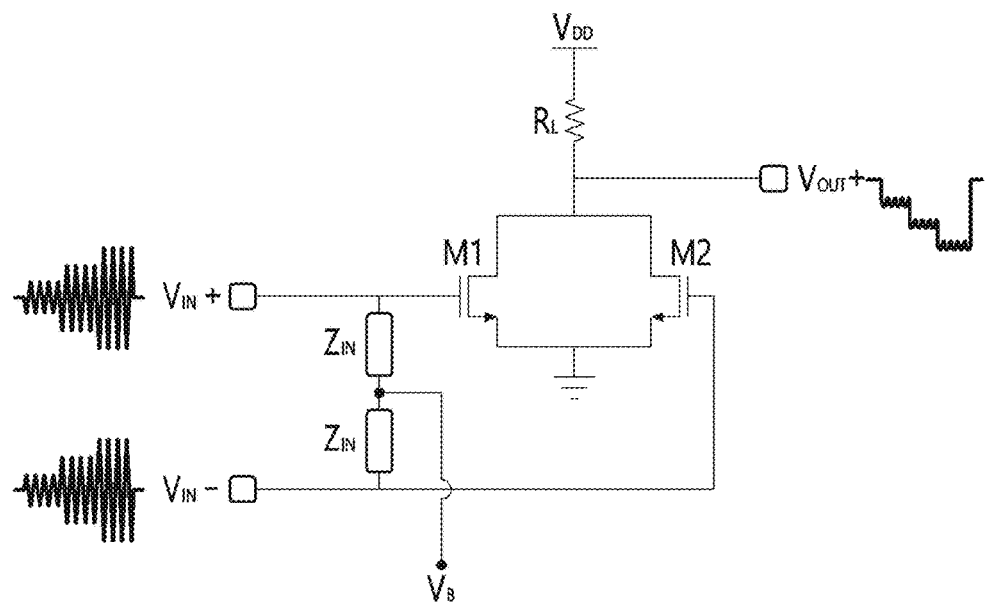
FIG. 1 is a diagram illustrating a circuit structure of a typical envelope detector (ED).

Specific matters, including the above problems to be solved, means for solving the problems, and effects of the present invention, are included in the embodiments, which will be described below, and the accompanying drawings. Advantages and features of the present invention and methods for achieving them will be made clear from embodiments described in detail below with reference to the accompanying drawings. The same reference numerals refer to the same components throughout the present specification.

Figure 3:
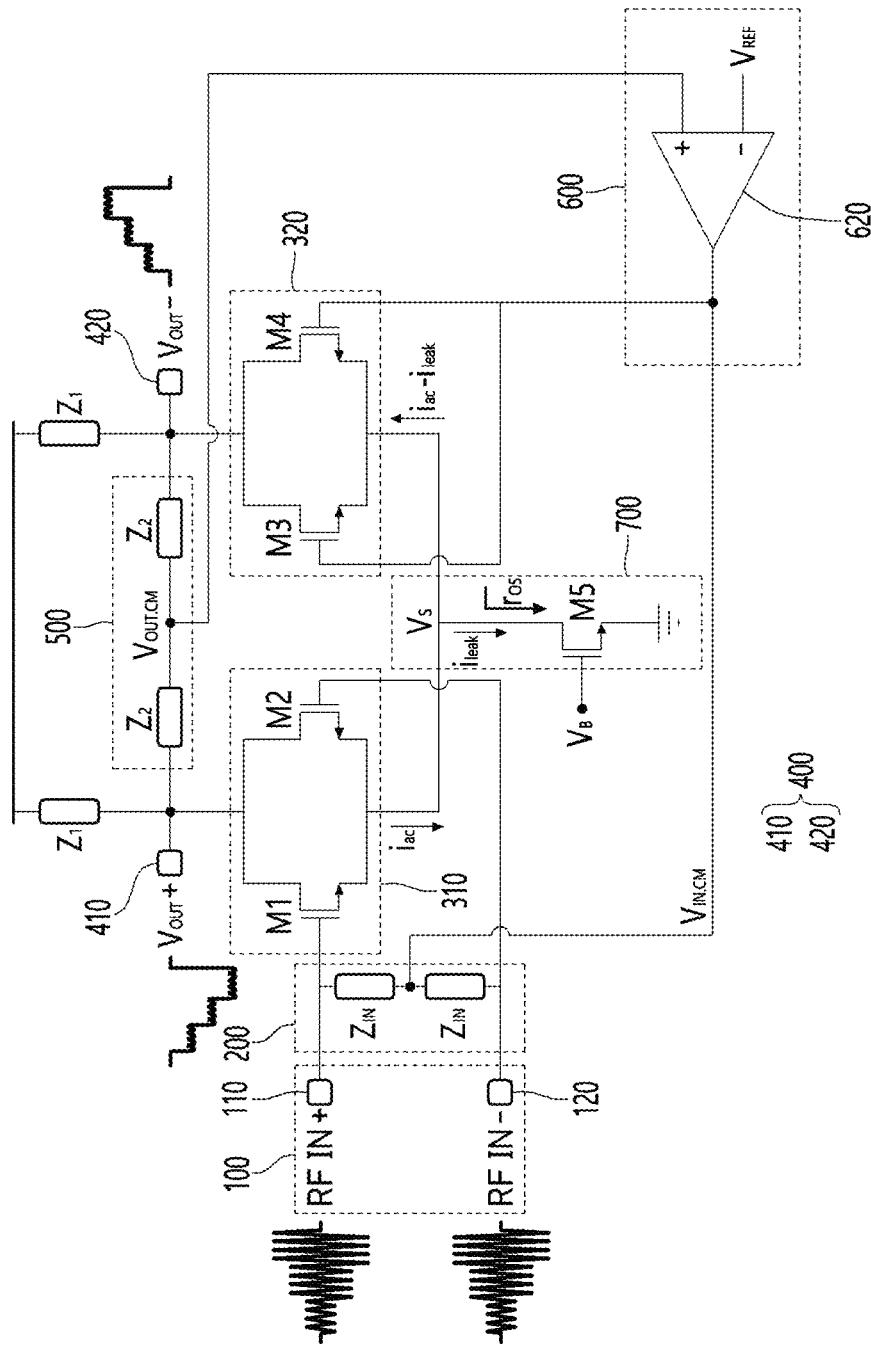
FIG. 3 is a diagram illustrating a circuit structure of a differential ED having a common mode feedback according to one embodiment of the present invention.

FIG. 3 is a diagram illustrating a circuit structure of a differential ED having a common mode feedback according to one embodiment of the present invention.

Referring to FIG. 3, the differential ED having a common mode feedback according to one embodiment of the present invention includes an input terminal unit 100, a first voltage output unit 200, a first amplification unit 310, a second amplification unit 320, an output terminal 400, a second voltage output unit 500, a feedback output unit 600, and a constant current source unit 700.

The input terminal unit 100 serves to receive a radio frequency (RF) signal received through an antenna or a low-noise amplifier and includes a pair of input terminals 110 and 120 which separate and receive positive and negative components of the RF signal.

Here, the first input terminal 110 may correspond to a positive (+) input terminal for receiving a first input signal $V_{IN+}$ corresponding to the positive component of the RF signal, and the second input terminal 120 may correspond to a negative (−) input terminal for receiving a second input signal $V_{IN-}$ corresponding to the negative component of the RF signal.

The first voltage output unit 200 outputs a first common mode voltage $V_{IN.CM}$ between the first input terminal 110 and the second input terminal 120.

The first voltage output unit 200 may include a pair of input impedance elements $Z_{IN}$ and may be connected between the first input terminal 110 and the second input terminal 120.

In this case, the pair of input impedance elements $Z_{IN}$ have the same impedance value, and the first voltage output unit 200 may output the first common mode voltage $V_{IN.CM}$ corresponding to an average value of the first input signal $V_{IN+}$ and the second input signal $V_{IN-}$.

The first amplification unit 310 receives the first and second input signals $V_{IN+}$ and $V_{IN-}$ corresponding to the positive and negative components of the RF signal, respectively, as a differential pair and amplifies the differential pair to output a first output signal $V_{OUT+}$.

The second amplification unit 320 receives the first common mode voltage $V_{IN.CM}$ and operates in a current amplifier mode to output a second output signal $V_{OUT-}$.

The second amplification unit 320 operates in a current amplifier mode using a current signal $i_{ac}\text{-}i_{leak}$ provided from the first amplification unit 310 as an input signal.

Here, the first amplification unit 310 and the second amplification unit 320 may each include a differential amplification circuit in which a pair of n-channel metal oxide semiconductor (NMOS) transistors with the same size, which face each other, are disposed in a differential structure.

In addition, source terminals of a first NMOS transistor M1 and a second NMOS transistor M2 of the first amplification unit 310 and source terminals of a third NMOS transistor M3 and a fourth NMOS transistor M4 of the second amplification unit 320 may be commonly connected.

Figure 2:
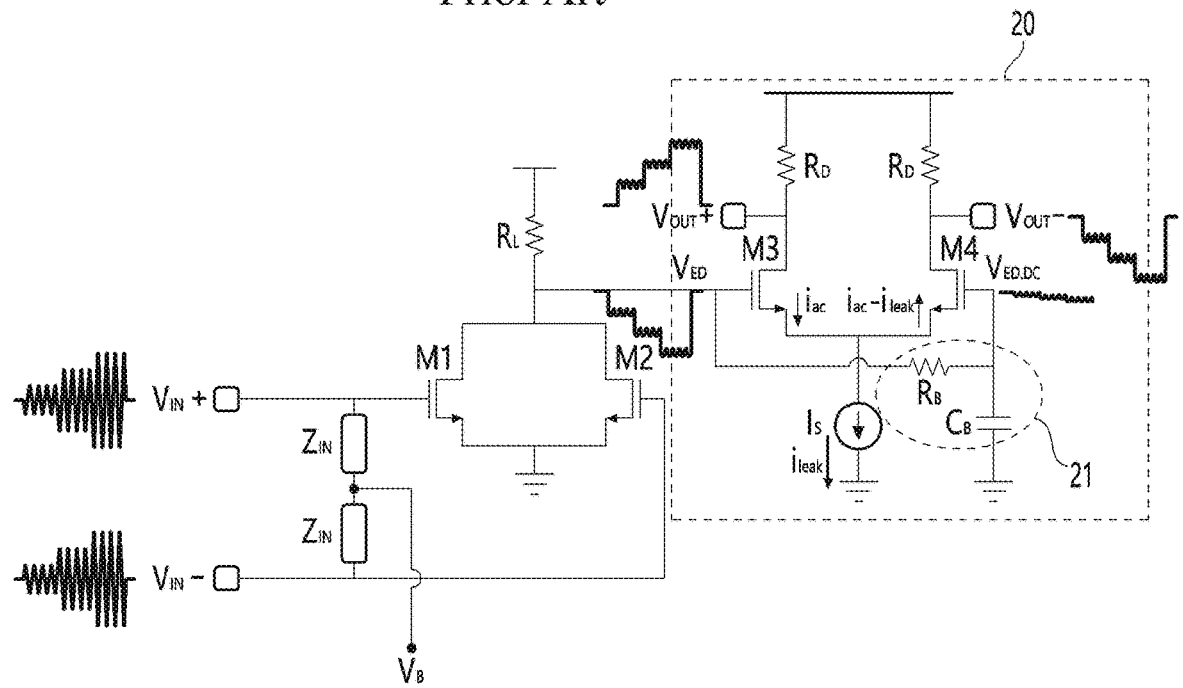
FIG. 2 is a diagram illustrating an example of an ED with a differential signal output structure according to the related art.

In this case, the first and second NMOS transistors M1 and M2 of the first amplification unit 310 play the same role as the transistor "M3" of the single-differential signal conversion circuit shown in FIG. 2, and the third and fourth NMOS transistors M3 and M4 of the second amplification unit 320 serve the same role as the transistor "M4" of the single-differential signal conversion circuit shown in FIG. 2, thereby having a single-differential conversion function on their own.

The constant current source unit 700 performs a constant current operation to provide a constant DC current to each of the first amplification unit 310 and the second amplification unit 320.

The constant current source unit 700 may include a current source transistor M5 whose drain terminal is connected to a common source line to which the source terminals of the first and second amplification units 310 and 320 are commonly connected.

Here, when the current source transistor M5 operates as a constant current source, the current source transistor M5 may minimize a leakage current $i_{leak}$ of a small signal current lac of the first amplification unit 310 and supply the remaining current $i_{ac}\text{-}i_{leak}$ not including the leakage current $i_{leak}$ of the small signal current $i_{ac}$, to the common source of the second amplification unit 320.

In this case, the first amplification unit 310 and the second amplification unit 320 may output the first output signal $V_{OUT+}$ and the second output signal $V_{OUT-}$, respectively, based on a current provided when the current source transistor M5 operates as the constant current source.

The output terminal 400 includes a first output terminal 410 and a second output terminal 420 to which the first and second output signals $V_{OUT+}$ and $V_{OUT-}$ output from the first and second amplification units 310 and 320 are applied, respectively.

Here, the first output terminal 410 corresponds to a positive (+) output terminal and may be connected to common drain terminals of the first and second NMOS transistors M1 and M2 corresponding to the first amplification unit 310, and the second output terminal 420 corresponds to a negative (−) output terminal and may be connected to common drain terminals of the third and fourth NMOS transistors M3 and M4 corresponding to the second amplification unit 320.

The second voltage output unit 500 outputs a second common mode voltage $V_{OUT.CM}$ between the first output terminal 410 and the second output terminal 420.

The second voltage output unit 500 may include a pair of output impedance elements $Z_2$ and may be connected in parallel between the first output terminal 410 and the second output terminal 420.

In this case, the pair of output impedance elements $Z_2$ have the same impedance value and may have a large value of 2 kΩ or more to prevent a decrease in output $V_{OUT}$ due to impedance.

In this case, the second voltage output unit 500 may output the second common mode voltage $V_{OUT.CM}$ corresponding to an average value of the first output signal $V_{OUT+}$ and the second output signal $V_{OUT-}$.

The feedback output unit 600 includes an operational amplifier 620 which compares the second common mode voltage $V_{OUT.CM}$ with a preset reference voltage $V_{REF}$ and generates a signal by amplifying an error between the two voltages.

Here, the reference voltage $V_{REF}$ may be applied to an inverting (−) input terminal of the operational amplifier 620, and a non-inverting (+) input terminal of the operational amplifier 620 may be connected between the pair of output impedance elements $Z_2$.

Figure 9:
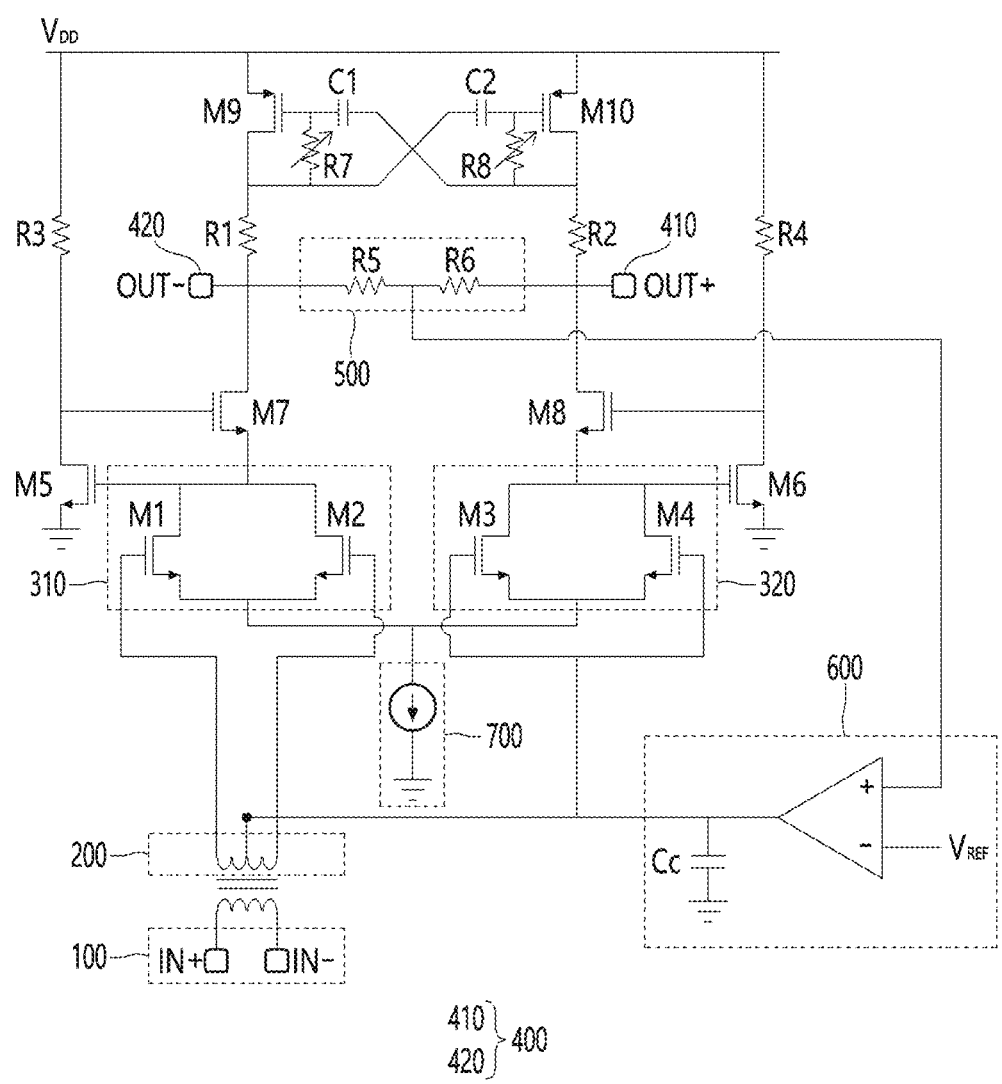
FIG. 9 is a diagram illustrating an example of a circuit structure of a differential ED formed by applying the circuit structure of FIG. 3.

For example, as shown in FIG. 9, when the second voltage output unit 500 includes a pair of resistors R5 and R6, the non-inverting (+) input terminal of the operational amplifier 620 of the feedback output unit 600 may be connected to a point between the two resistors.

In this case, the reference voltage $V_{REF}$ may be supplied from a bandgap reference voltage generator (BGR) to have always a constant DC voltage even in a variation depending on a process, a voltage, and a temperature (PVT variation).

In addition, a range of the reference voltage $V_{REF}$ may be typically $$\frac{V_{DD}}{4} \sim \frac{3V_{DD}}{4}$$

based on a value of a power supply voltage $V_{DD}$.

The feedback output unit 600 amplifies the error signal generated by the operational amplifier 620 and outputs the amplified error signal to the first voltage output unit 200 as feedback.

In this case, the first voltage output unit 200 may be biased to the first common mode voltage $V_{IN.CM}$ based on the signal fed back from the feedback output unit 600.

In this case, due to the feedback, the second common mode voltage $V_{OUT.CM}$ is constantly fixed to the reference voltage $V_{REF}$, and thus the DC voltages of the first output signal $V_{OUT+}$ and the second output signal $V_{OUT-}$ are always kept constant so that a stable DC bias is formed even in a temperature change, and the DC voltage of the first common mode voltage $V_{IN.CM}$ is changed according to the temperature change, thereby improving temperature characteristics.

In addition, the first common mode voltage $V_{IN.CM}$ supplies the same DC voltage to gates of the first and second NMOS transistors M1 and M2 and gates of the third and fourth NMOS transistors M3 and M4, and thus the DC voltage of the first output signal $V_{OUT+}$, which is the output of the first amplification unit 310, and the second output signal $V_{OUT-}$, which is the output of the second amplification unit 320, are made the same without a DC offset.

Meanwhile, FIG. 9 is a diagram illustrating an example of a circuit structure of a differential ED formed by applying the circuit structure of FIG. 3.

In the case of the differential ED shown in FIG. 9, the input terminal unit 100 and the first voltage output unit 200 may be connected to a primary side and a secondary side of a given transformer, respectively.

Here, the input terminal unit 100 serves to receive an RF signal through a pair of input terminals IN+ and IN− connected to both terminals of the primary side of the transformer, and the first voltage output unit 200 serves to output a voltage applied to the secondary side of the transformer.

In addition, in the differential ED shown in FIG. 9, a plurality of NMOS transistors M5, M6, M7, and M8 may be connected between the first amplification unit 310 and the second output terminal 420 and between the second amplification unit 320 and the first output terminal 410 to obtain a larger output signal.

Specifically, a gate terminal of the fifth NMOS transistor M5 may be connected to the common drain terminal of the first and second NMOS transistors M1 and M2 of the first amplification unit 310 and a source terminal thereof may be connected to a ground. A source terminal of the seventh NMOS transistor M7 may be connected to the drain terminal of the first amplification unit 310, a drain terminal thereof may be connected to the second output terminal 420, and a gate terminal thereof may be connected to a drain terminal of the fifth NMOS transistor M5.

In addition, a gate terminal of the sixth NMOS transistor M6 may be connected to the common drain terminal of the third and fourth NMOS transistors M3 and M4 of the second amplification unit 320 and a source terminal thereof may be connected to the ground. A source terminal of the eighth NMOS transistor M8 may be connected to the drain terminal of the second amplification unit 320, a drain terminal thereof may be connected to the first output terminal 410, and a gate terminal thereof may be connected to a drain terminal of the sixth NMOS transistor M6.

Figure 4A:
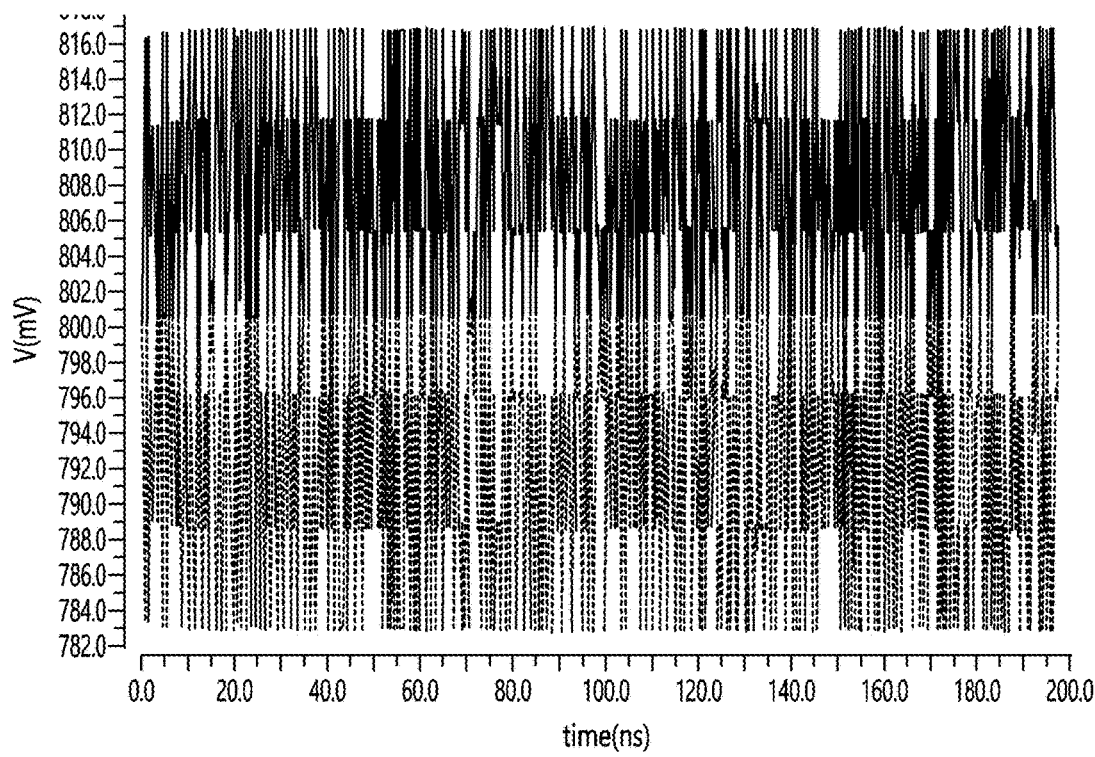
FIGS. 4A and 4B are graphs showing waveforms output from both terminals of the differential ED with the circuit structure of FIG. 3.
Figure 4B:
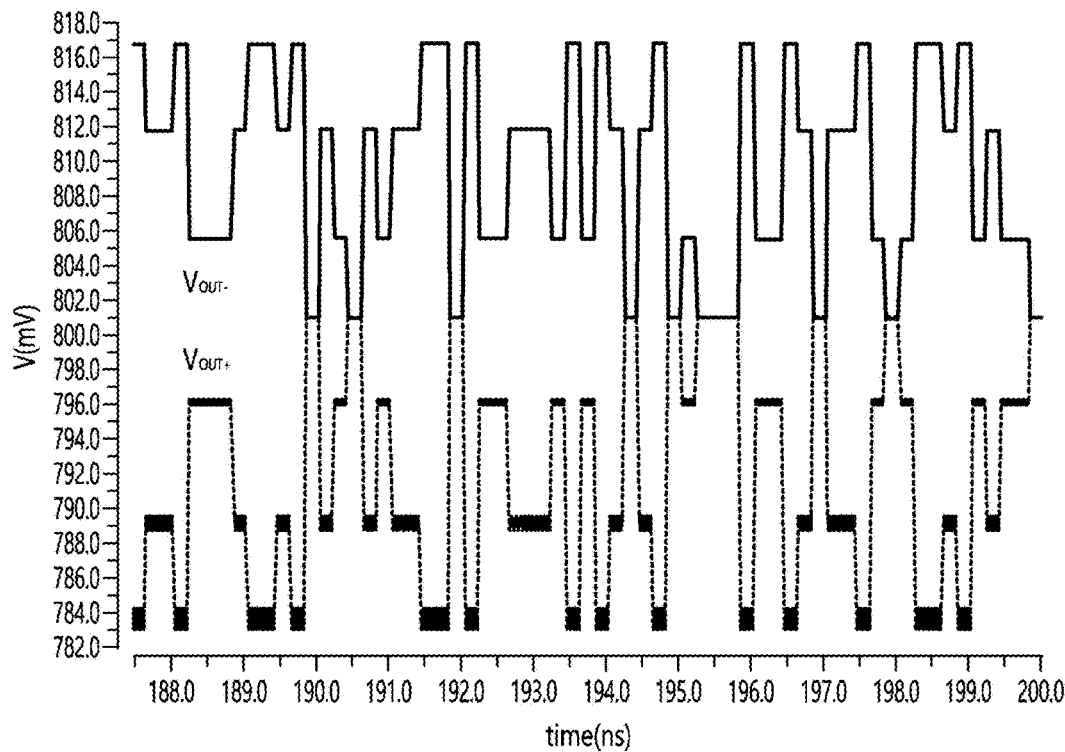
Figure 5:
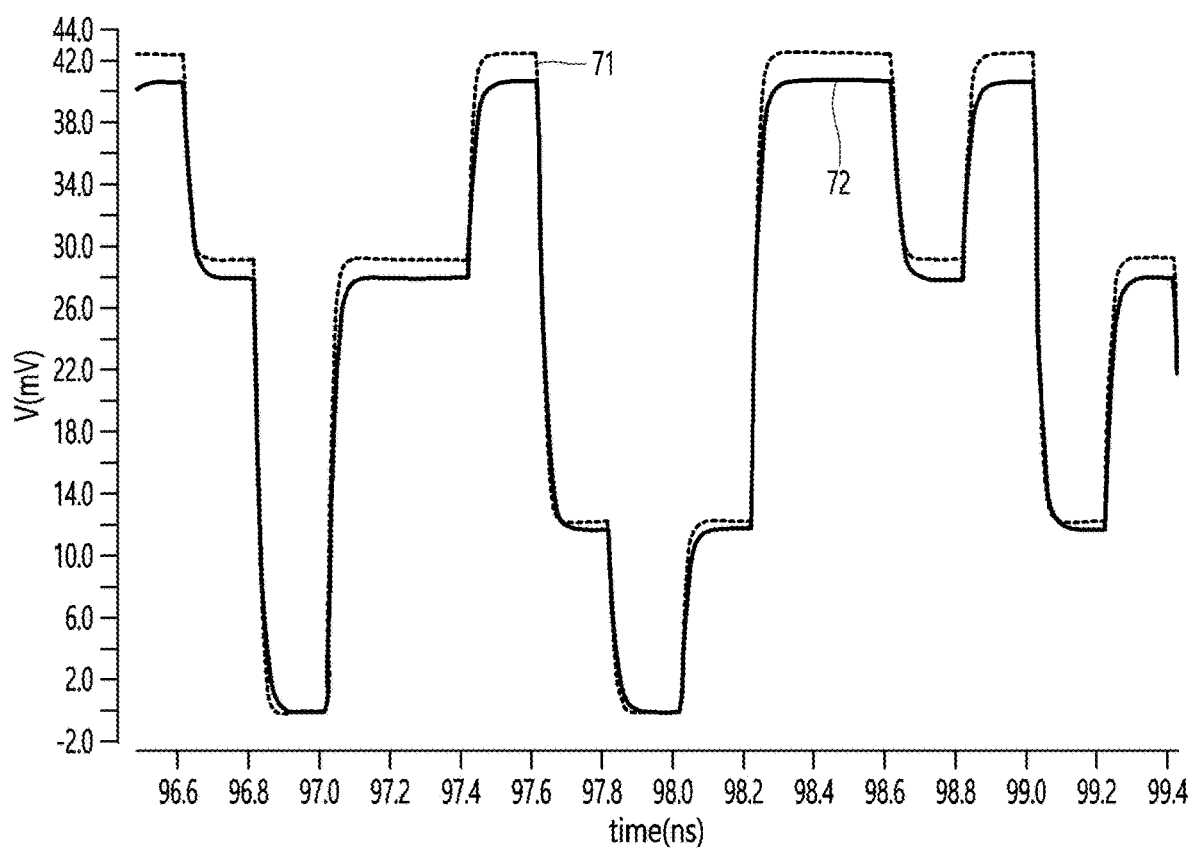
FIG. 5 is a graph showing a differential output waveform according to a temperature change of the differential ED with the circuit structure of FIG. 3.
Figure 6:
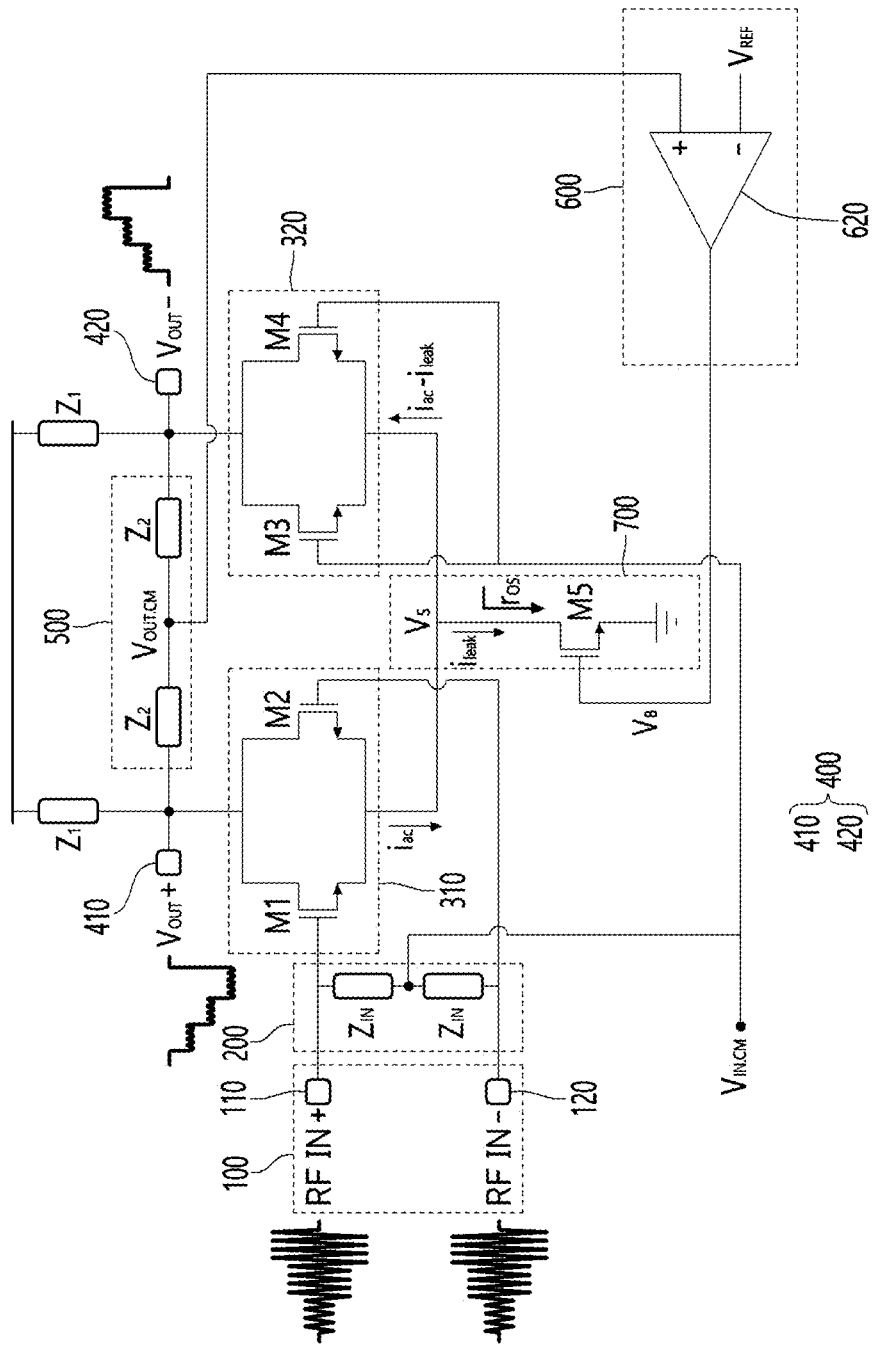
FIG. 6 is a diagram illustrating a circuit structure with a feedback location different from that of the differential ED shown in FIG. 3.
Figure 7:
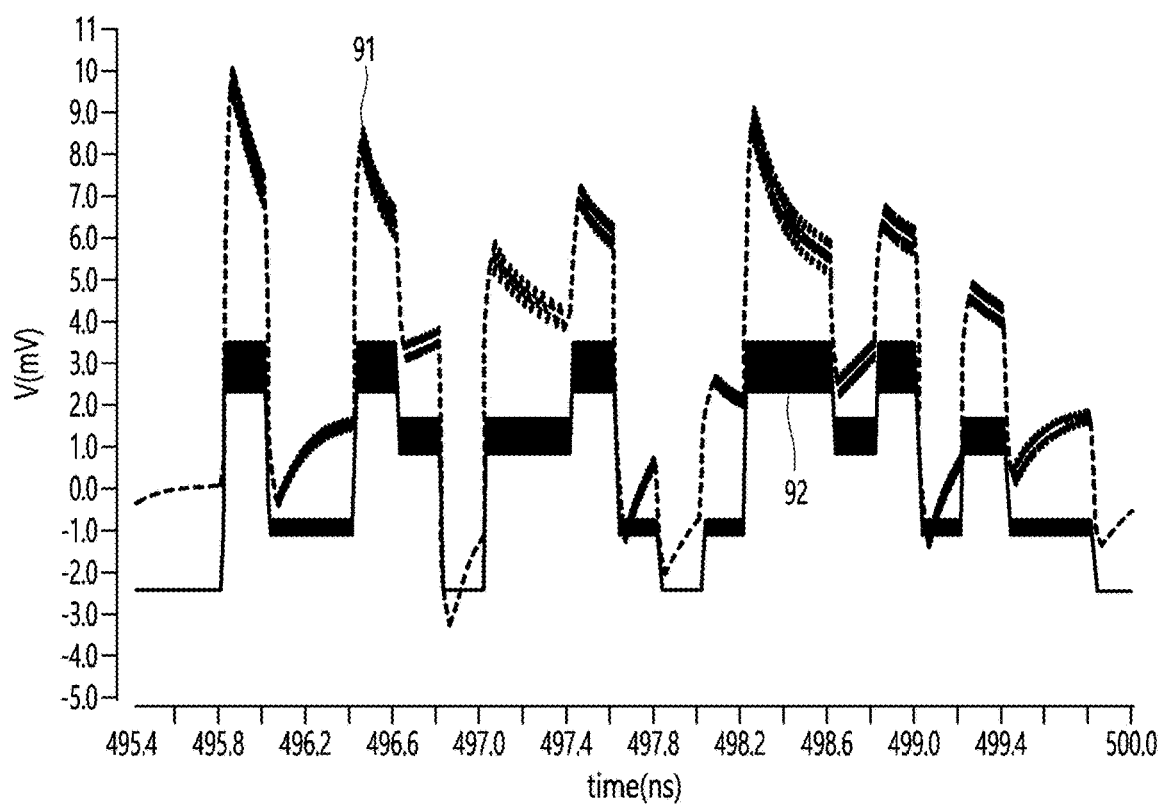
FIG. 7 is a graph showing a comparison between voltage waveforms of common source nodes of the differential EDs with the circuit structures of FIGS. 3 and 6.
Figure 8:
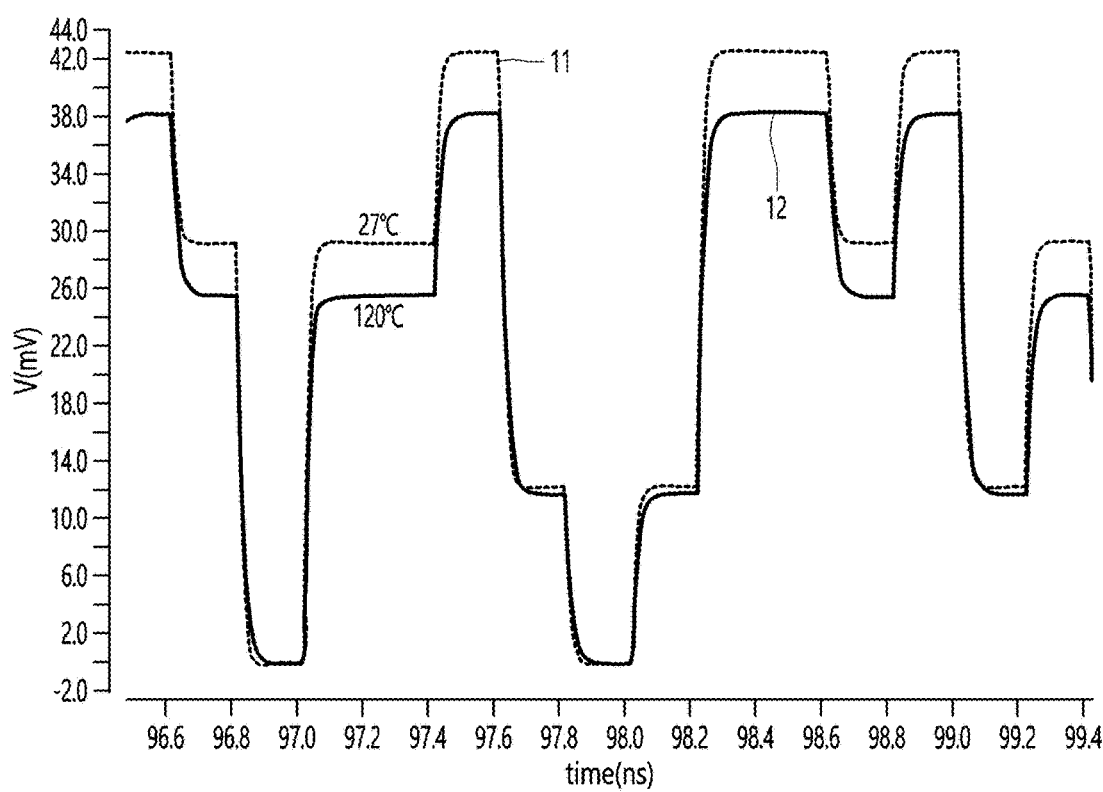
FIG. 8 is a graph showing a differential output waveform according to a temperature change of the differential ED with the circuit structure of FIG. 6.

FIGS. 4A and 4B are graphs showing waveforms output from both terminals of the differential ED with the circuit structure of FIG. 3, FIG. 5 is a graph showing a differential output waveform according to a temperature change of the differential ED with the circuit structure of FIG. 3, FIG. 6 is a diagram illustrating a circuit structure with a feedback location different from that of the differential ED shown in FIG. 3, FIG. 7 is a graph showing a comparison between voltage waveforms of common source nodes of the differential EDs with the circuit structures of FIGS. 3 and 6, and FIG. 8 is a graph showing a differential output waveform according to a temperature change of the differential ED with the circuit structure of FIG. 6.

Hereinafter, output waveform characteristics of the differential ED having common mode feedback according to the present invention and an effect according to a feedback position in the circuit structure will be compared and explained with reference to FIGS. 4 to 8 and the above-described drawings as follows.

First, the differential ED according to the present invention may provide differential output waveforms $V_{OUT-}$ and $V_{OUT+}$ without waveform distortion as shown in FIGS. 4A and 4B, and a maximum difference between an output voltage range 71 at a temperature of 27° C. and an output voltage range 72 at a temperature of 120° C. becomes very small at 1.0 mV as shown in FIG. 5, and thus the differential ED may have characteristics in which a differential output swing size according to a temperature change is almost constant.

Next, output characteristics of the differential ED according to the present invention and the circuit structure shown in FIG. 6 are compared as follows.

In the differential ED (see FIG. 3) according to the present invention and the circuit structure shown in FIG. 6, since the constant current source unit 700 includes the current source transistor M5, and an output impedance viewed from the drain of the current source transistor M5 has a finite value $r_{O5}$, and thus the leakage current $i_{leak}$ for a small signal current $i_{ac}$ occurs from the first amplification unit 310. Thus, the small signal current $i_{ac}$ of the first amplification unit 310 and the small signal current $i_{ac}-i_{leak}$ of the second amplification unit 320 have a difference by the leakage current $i_{leak}$, and thus the magnitudes of the first output signal $V_{OUT+}$ and the second output signal $V_{OUT-}$ are slightly different so that an unwanted ripple occurs in the second common mode voltage $V_{OUT,CM}$ of the second voltage output unit 500 and is input to the non-inverting (+) input terminal of the operational amplifier 620 to exhibit in the feedback output unit 600.

In this regard, first, as shown in FIG. 7, in a common source voltage Vs of the first and second amplification units 310 and 320, the differential ED (see FIG. 3) according to the present invention may obtain a clean output waveform 92 by removing ripples through common-mode rejection when the output of the feedback output unit 600 is connected to an output $V_{IN,CM}$ of the first voltage output unit 200, which is connected to the gate terminals of the plurality of NMOS transistors M1, M2, M3, and M4 corresponding to the first and second amplification units 310 and 320, whereas, the circuit structure shown in FIG. 6 outputs a distorted waveform 91 as ripples are added to the voltage waveform driven by the small signal current and thus the voltage waveform is distorted when the output of the feedback output unit 600 is connected to the gate terminal of the constant current source M5.

Second, in the case of the circuit structure shown in FIG. 6, as shown in FIG. 8, a maximum difference value between an output voltage range 11 at a temperature of 27° C. and an output voltage range 12 at a temperature of 120° C. is 4.0 mV and has a value that is greater than that of the differential ED according to the present invention (see FIG. 5) so that it can be confirmed that performance of the circuit structure is lower than that of the differential ED of the present invention.

Thus, according to the above-described present invention, the output value of the ED can be hardly affected by a temperature change, and the output DC voltage can also be fixed constantly so that there is an advantageous effect on an input bias of an amplifier at a next stage.

According to the present invention, since the ED provides a differential output signal by itself, there is no need to add a single-differential conversion circuit, and since all circuits of a receiver form a differential structure, there is an effect of being able to minimize a change in power supply voltage due to an instantaneous current change, thereby reducing noise and supplying stable power.

As described above, the present invention has been described in detail through exemplary embodiments, but the present invention is not limited thereto and may be implemented in various forms within the scope of the appended claims.

In particular, since the above contents describe the features and technical strengths of the present invention rather broadly so as to enable a better understanding of the scope of the claims of the present invention to be described below, it should be recognized by those skilled in the art that the above-described concept and specific embodiments of the present invention can be immediately used as a basis for designing or modifying other shapes for carrying out similar purposes to the present invention.

In addition, it will be understood that the above-described embodiments are merely exemplary according to the present invention, and that the present invention can be implemented in various modified and changed forms within the scope of the technical idea of the present invention by those skilled in the art. Accordingly, the disclosed embodiments should be considered in an illustrative rather than a restrictive sense, and such various modifications and changes are also included within the scope of the technical idea of the present invention, as indicated in the appended claims of the present invention, and all differences within the scope equivalent thereto should be construed as being included in the present invention.

The invention claimed is:

1. A differential envelope detector (ED) having common mode feedback, the differential ED comprising:
    an input terminal unit including first and second input terminals configured to respectively receive positive and negative components of a radio frequency (RF) signal received through an antenna or a low-noise amplifier;
    a first voltage output unit provided between the first and second input terminals and configured to output a first common mode voltage;
    a first amplification unit configured to receive first and second input signals respectively corresponding to the positive and negative components of the RF signal as a differential pair and amplify the first and second input signals to output a first output signal;
    a second amplification unit configured to receive the first common mode voltage and operate in a current amplifier mode to output a second output signal;
    a constant current source unit configured to supply a constant DC (direct) current to the first amplification unit and the second amplification unit;
    an output terminal including first and second output terminals to which the first output signal and the second output signal are applied, respectively; and
    a second voltage output unit provided between the first and second output terminals and configured to output a second common mode voltage.

2. The differential ED of claim 1, further comprising a feedback output unit configured to compare the second common mode voltage with a preset reference voltage, generate a signal obtained by amplifying an error between the second common mode voltage and the present reference voltage, and output the signal to the first voltage output unit as feedback.

3. The differential ED of claim 2, wherein the first voltage output unit includes a pair of input impedance elements, is connected between the first and second input terminals, and biases the first common mode voltage based on the feed-backed output signal.

4. The differential ED of claim 2, wherein:
the second voltage output unit includes a pair of output impedance elements and is connected between the first and second output terminals;
the feedback output unit includes an operational amplifier configured to generate a signal obtained by amplifying the error; and
the reference voltage is applied to an inverting input terminal of the operational amplifier, and a non-inverting input terminal of the operational amplifier is connected between the pair of output impedance elements.

5. The differential ED of claim 1, wherein:
each of the first amplification unit and the second amplification unit includes a differential amplification circuit in which a pair of n-channel metal oxide semiconductor (NMOS) transistors with the same size, which face each other, are disposed in a differential structure;
the constant current source unit includes a current source transistor whose drain terminal is connected to a common source line to which source terminals of the first and second amplification units are commonly connected; and
while a leakage current of a small signal current of the first amplification unit is minimized when the current source transistor operates as a constant current source, the current source transistor supplies a remaining current not including the leakage current of the small signal current to a common source of the second amplification unit.

* * * * *